(12) United States Patent
Yamada et al.

(10) Patent No.: US 9,568,501 B2
(45) Date of Patent: Feb. 14, 2017

(54) PROBE CARD ATTACHING METHOD

(71) Applicant: Tokyo Electron Limited, Tokyo (JP)

(72) Inventors: Hiroshi Yamada, Nirasaki (JP); Hiroki Obi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 32 days.

(21) Appl. No.: 14/433,874

(22) PCT Filed: Aug. 30, 2013

(86) PCT No.: PCT/JP2013/073999
§ 371 (c)(1),
(2) Date: Apr. 7, 2015

(87) PCT Pub. No.: WO2014/057750
PCT Pub. Date: Apr. 17, 2014

(65) Prior Publication Data
US 2015/0276811 A1    Oct. 1, 2015

(30) Foreign Application Priority Data

Oct. 9, 2012    (JP) .................................. 2012-224554

(51) Int. Cl.
*G01R 1/073* (2006.01)
*G01R 1/04* (2006.01)
*G01R 31/28* (2006.01)

(52) U.S. Cl.
CPC ......... *G01R 1/07342* (2013.01); *G01R 1/0491* (2013.01); *G01R 31/2891* (2013.01); *G01R 31/2893* (2013.01)

(58) Field of Classification Search
CPC ............ G01R 31/2891; G01R 1/07342; G01R 1/0491; G01R 31/2893
See application file for complete search history.

(56) References Cited

U.S. PATENT DOCUMENTS

| 5,444,386 A | 8/1995 | Mizumura |
| 2004/0164756 A1* | 8/2004 | Suzuki ............... G01R 31/2851 324/756.03 |
| 2011/0316571 A1* | 12/2011 | Kiyokawa .......... G01R 31/2891 324/750.16 |

FOREIGN PATENT DOCUMENTS

| JP | 05-59841 U | 8/1993 |
| JP | 2002-022768 A | 1/2002 |
| WO | 2011/027392 A1 | 3/2011 |

OTHER PUBLICATIONS

International Search Report for PCT/JP2013/073999 dated Nov. 5, 2013.

* cited by examiner

*Primary Examiner* — Patrick Assouad
*Assistant Examiner* — Haidong Zhang
(74) *Attorney, Agent, or Firm* — Pearne & Gordon LLP

(57) ABSTRACT

A probe card attaching method makes it easy to attach/detach a probe card to/from a transfer stage. In a wafer inspection apparatus 10, a reference position is determined by moving a transfer stage 18 to align a stage-side camera 28 with a tester-side camera 16 in a tester 15, a first distance from the reference position to a center of a pogo frame 19 in the tester 15 is determined by checking a pin mark 24 in the tester 15 with the stage-side camera 28, a second distance from the reference position to a center of a probe card 20 is determined by checking a target mark 32 in the probe card 20 with the tester-side camera 16. Then, the transfer stage 18 is moved to allow the probe card 20 to face the pogo frame 19 based on the reference position, the first distance, and the second distance.

8 Claims, 13 Drawing Sheets

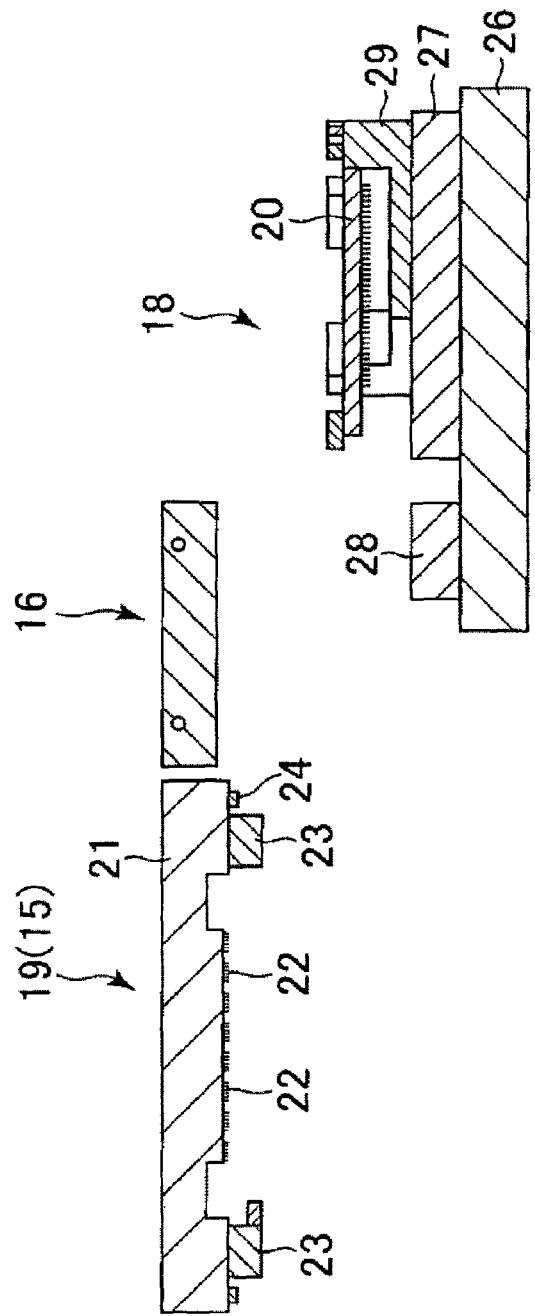

PROBE CARD ATTACHING METHOD

CROSS-REFERENCE TO RELATED APPLICATION

This Application is a U.S. national phase application under 35 U.S.C. §371 of PCT Application No. PCT/JP2013/073999 filed on Aug. 30, 2013, which claims the benefit of Japanese Patent Application No. 2012-224554 filed on Oct. 9, 2012, the entire disclosures of which are incorporated herein by reference.

TECHNICAL FIELD

The embodiments described herein pertain generally to a probe card attaching method of attaching a probe card for wafer inspection to a tester facing a wafer.

BACKGROUND

In order to inspect a wafer on which multiple semiconductor devices are formed, a prober has been used as an inspection apparatus. The prober includes a probe card facing the wafer, and the probe card includes a plate-shaped base member and multiple column-shaped contact probes as contact terminals respectively arranged on a wafer facing surface of the base member to face electrode pads or solder bumps in the semiconductor devices on the wafer (see, for example, Patent Document 1).

In the prober, the contact probes of the probe card are brought into contact with the respective electrode pads or solder bumps and an electric current is allowed to flow from the contact probes to electric circuits of the semiconductor devices connected with the electrode pads or solder bumps, respectively, so that the prober can inspect a conducting state of each electric circuit.

Further, in order to improve inspection efficiency of a wafer, there has been developed a wafer inspection apparatus in which multiple probe cards are arranged in an inspection chamber and semiconductor devices on a wafer can be inspected by a probe card while another wafer is transferred to another probe card by a transfer stage. In this wafer inspection apparatus, multiple testers as interfaces for wafer inspection are arranged to be allowed to face the wafer within the inspection chamber, and a probe card is attached to each tester.

In the above-described wafer inspection apparatus, the probe cards need to be replaced due to wear of the contact probes, or the like. When the probe cards are replaced, the transfer stage receives the probe cards from the respective testers and transfers new probe cards or probe cards after the maintenance is completed to the respective testers. At this time, multiple electrodes of a probe card corresponding to respective contact probes need to be accurately brought into contact with pogo pins as a group of multiple contact terminals that are provided in a tester to be connected to an inspection circuit. Accordingly, when a new probe card or a probe card after the maintenance is completed is transferred to a tester, the transfer stage including a positioning pin inserts this positioning pin into a pin hole of the probe card in order for a position of the probe card not to be deviated.

Recently, there has been developed a probe card that inspects multiple semiconductor devices formed on a wafer at the same time. In such a probe card, multiple electrodes corresponding to respective contact probes are densely arranged. Thus, it is necessary to further improve accuracy in positioning the probe card to accurately bring the electrodes into contact with respective pogo pins of a tester. The accuracy in positioning the probe card can be improved by reducing a gap (clearance) between a positioning pin and a pin hole.

Patent Document 1: Japanese Patent Laid-open Publication No. 2002-022768

DISCLOSURE OF THE INVENTION

Problems to be Solved by the Invention

However, if a gap between a positioning pin and a pin hole is reduced, the positioning pin is caught by a side surface of the pin hole, so that it becomes difficult to attach/detach a probe card to/from a transfer stage.

Example embodiments provide a probe card attaching method that makes it easy to attach/detach a probe card to/from a transfer stage.

Means for Solving the Problems

In order to solve the above-described problem, in accordance with an example embodiment, a probe card attaching method of respectively attaching probe cards to multiple testers by a transfer stage in a wafer inspection apparatus, including the multiple testers and the transfer stage that transfers a wafer as an inspection target to each of the testers, in which the probe cards each having probes to be contacted with the wafer are attached to the testers includes: providing a first camera configured to face the tester in the transfer stage; providing a second camera configured to face the transfer stage in the tester; determining a reference position where the first camera and the second camera are aligned with each other by moving the transfer stage; determining a position of a probe card attaching unit provided in the tester by checking a first mark provided in the tester with the first camera; determining a position of the probe card by checking a second mark provided in the probe card mounted on the transfer stage with the second camera; allowing the probe card to be aligned with the probe card attaching unit by moving the transfer stage based on the determined reference position, position of the probe card attaching unit and position of the probe card; and attaching the probe card to the probe card attaching unit by moving the transfer stage toward the probe card attaching unit.

In the example embodiment, a first distance from the reference position to a center of the probe card attaching unit may be determined by checking the first mark with the first camera, a second distance from the reference position to a center of the probe card may be determined by checking the second mark with the second camera, and the center of the probe card may be aligned with the center of the probe card attaching unit by moving the transfer stage based on the first distance and the second distance, after the second distance is determined.

In the example embodiment, the first mark may be offset from the center of the probe card attaching unit, the first camera may determine a position of the first mark, and the first distance may be the sum of a distance from the reference position to the position of the first mark and a distance from the center of the probe card attaching unit to the position of the first mark.

In the example embodiment, the second mark may be arranged along a circumference around the center of the probe card.

In the example embodiment, at least after the position of the probe card may be determined by the second camera, the transfer stage may hold the probe card to suppress the probe card from being relatively moved with respect to the transfer stage.

In the example embodiment, the transfer stage may hold the probe card through vacuum attraction.

In the example embodiment, when the probe card is mounted on the transfer stage, the probes of the probe card may be protruding toward the transfer stage and a probe card supporting member may be interposed between the probe card and the transfer stage.

In the example embodiment, when detaching the probe card from the probe card attaching unit, a position of the probe card supporting member may be determined by checking a third mark provided in the probe card supporting member mounted on the transfer stage with the second camera. Further, the transfer stage may be moved based on the determined reference position, position of the probe card attaching unit and position of the probe card supporting member to allow the probe card supporting member to be aligned with the probe card attaching unit, and the transfer stage may be moved toward the probe card attaching unit to bring the probe card supporting member into contact with the probe card attached to the probe card attaching unit.

In the example embodiment, a third distance from the reference position to a center of the probe card supporting member may be determined by checking the third mark with the second camera, and the center of the probe card supporting member may be aligned with the center of the probe card attaching unit by moving the transfer stage based on the first distance and the third distance, after the third distance is determined.

Effect of the Invention

In accordance with the example embodiments, a probe card is allowed to be aligned with a probe card attaching unit by moving a transfer stage based on a reference position determined by a first camera which is provided on the transfer stage to face a tester or a second camera which is provided on a tester to face the transfer stage, a position of the probe card attaching unit, and a position of the probe card. That is, even if the probe card is deviated with respect to the transfer stage, since a position of the probe card is determined by the second camera, it is not necessary to suppress a position of the probe card from being deviated with respect to the transfer stage. Thus, it is not necessary to form a positioning pin or a pin hole. As a result, it is easy to attach/detach the probe card to/from the transfer stage.

BRIEF DESCRIPTION OF THE DRAWINGS

FIG. 3B is a cross-sectional view taken along a line III-III in FIG. 3A.

MODE FOR CARRYING OUT THE INVENTION

Hereinafter, example embodiments will be explained with reference to the accompanying drawings.

A wafer inspection apparatus in which a probe card attaching method in accordance with the present example embodiment is performed will be described first.

Figure 1:
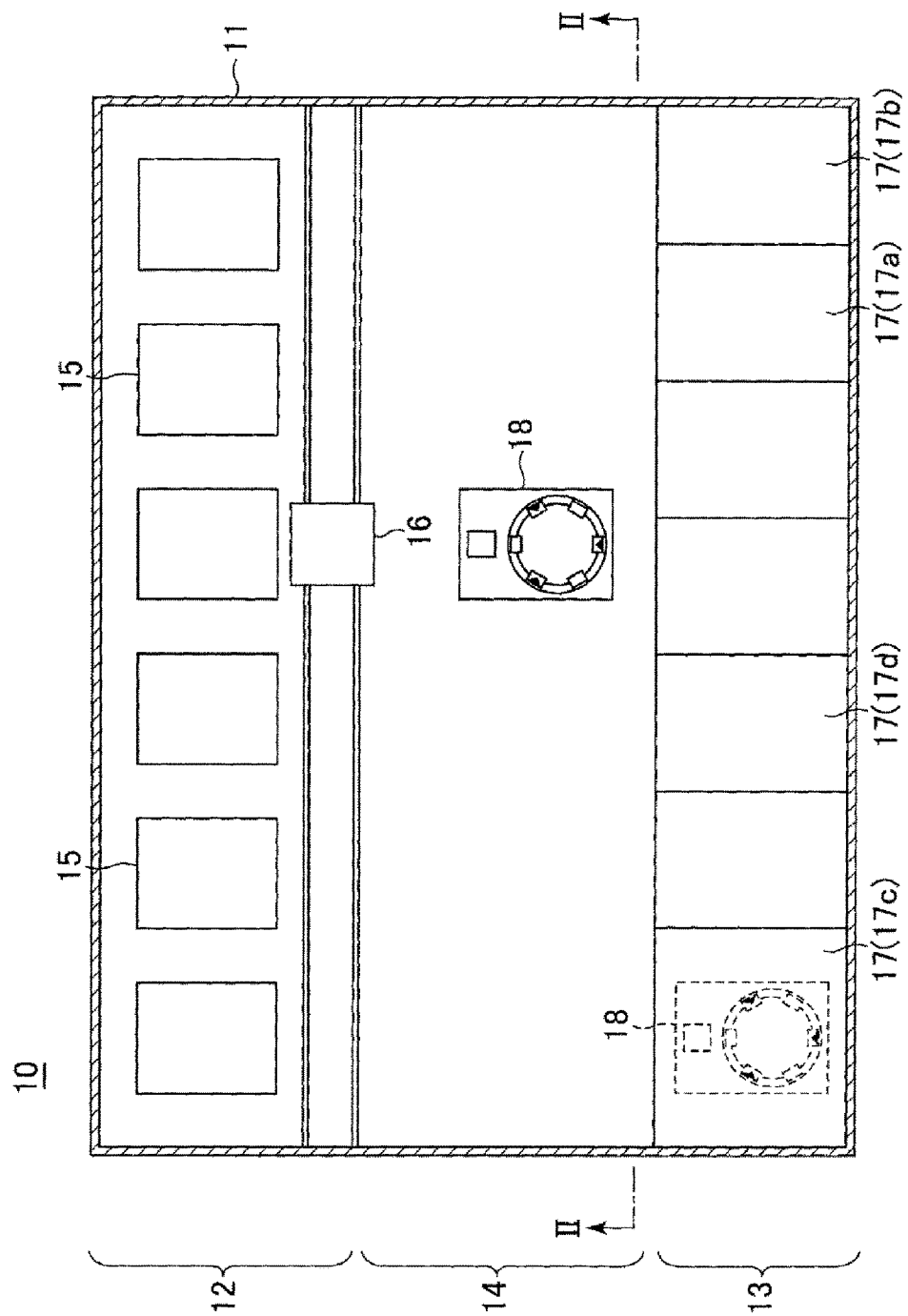
FIG. 1 is a horizontal cross-sectional view schematically illustrating a configuration of a wafer inspection apparatus in which a probe card attaching method in accordance with an example embodiment is performed.
Figure 2:
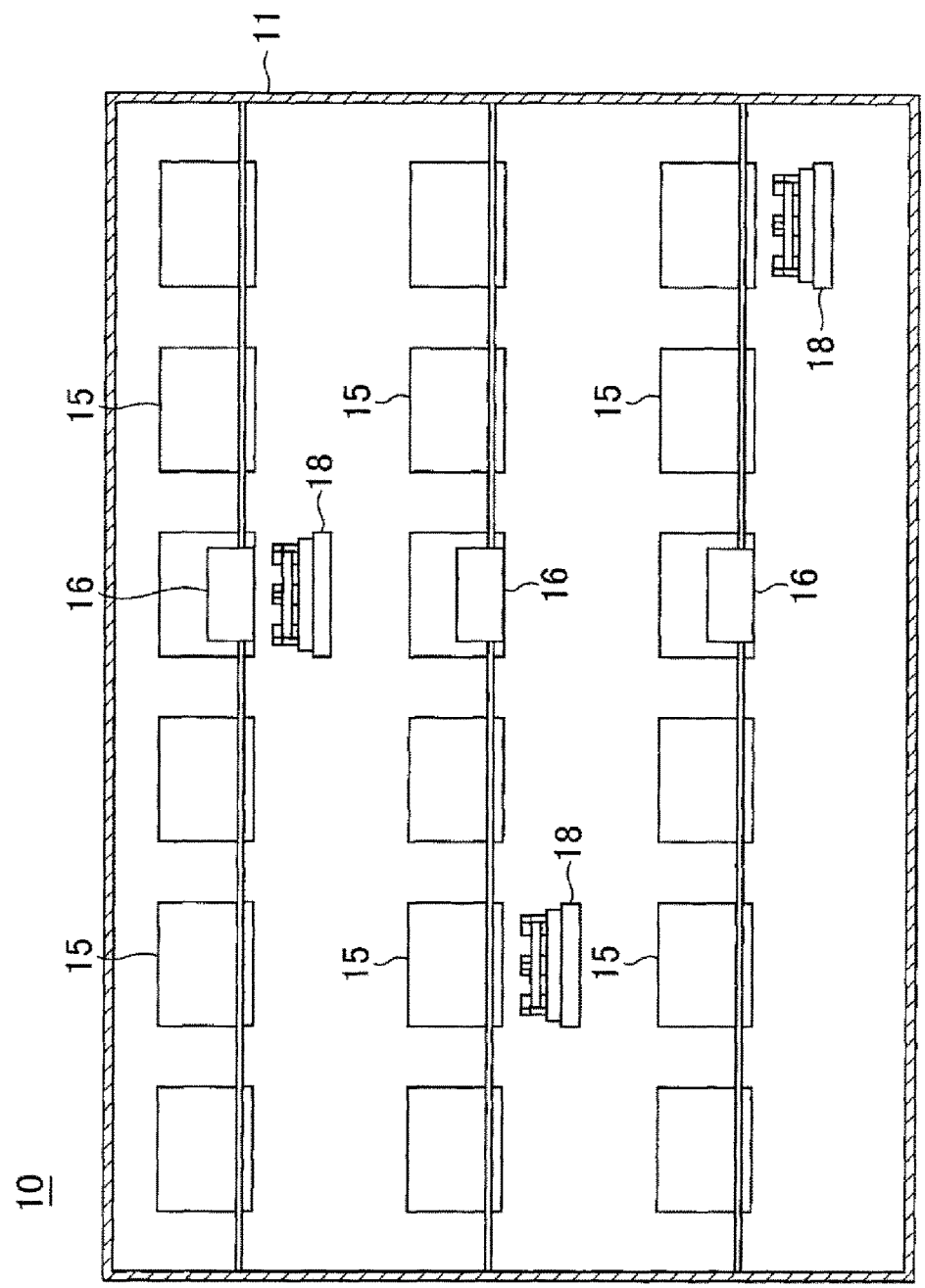
FIG. 2 is a cross-sectional view taken along a line II-II in FIG. 1.

FIG. 1 is a horizontal cross-sectional view schematically illustrating a configuration of the wafer inspection apparatus in which the probe card attaching method in accordance with the example embodiment is performed, and FIG. 2 is a cross-sectional view taken along a line II-II in FIG. 1.

In FIG. 1 and FIG. 2, a wafer inspection apparatus 10 includes an inspection chamber 11. The inspection chamber 11 includes an inspection section 12 in which electrical characteristics of semiconductor devices on a wafer are inspected; a loading/unloading section 13 in which the wafer or a probe card 20 to be described later are loaded/unloaded into/from the inspection chamber 11; and a transfer section 14 formed between the inspection section 12 and the loading/unloading section 13.

In the inspection section 12, multiple testers 15 as interfaces for wafer inspection are arranged. To be specific, three levels of rows of horizontally arranged testers are provided, and a single tester-side camera 16 (second camera) is arranged to correspond to each row of testers. Each tester-side camera 16 is configured to horizontally move along the corresponding row of testers, and when positioned in front of each tester 15 constituting the row of testers, the tester-side camera 16 determines a position of the probe card 20 transferred by a transfer stage 18 to be described later.

The loading/unloading section 13 is divided into multiple accommodation spaces 17, and in each accommodation space 17, a container configured to accommodate multiple wafers, for example, a port 17a configured to receive a FOUP, an aligner 17b configured to adjust a position alignment of the wafer, a loader 17c where the probe card 20 is loaded or unloaded, or a controller 17d configured to control operations of respective components of the wafer inspection apparatus 10 are arranged.

In the transfer section 14, the transfer stage 18 capable of moving to the inspection section 12 or the loading/unloading section 13 as well as the transfer section 14 is arranged. The transfer stage 18 is configured to receive the wafer from the port 17a of the loading/unloading section 13 and transfer the wafer to the tester 15 and also transfer a wafer after the inspection on electrical characteristics of semiconductor devices is completed to the port 17a from is completed tester 15. Further, the transfer stage 18 is configured to transfer a probe card 20 in need of maintenance to the loader 17c of the loading/unloading section 13 from is completed tester 15 and also transfer a new probe card 20 or a probe card 20 after the maintenance is completed to the tester 15 from the loader 17c.

In the wafer inspection apparatus 10, each tester 15 inspects electrical characteristics of semiconductor devices on the transferred wafer. While the transfer stage 18 transfers a wafer toward a tester 15, another tester 15 can inspect electrical characteristics of semiconductor devices on another wafer. Thus, inspection efficiency of a wafer can be improved.

Figure 3A:
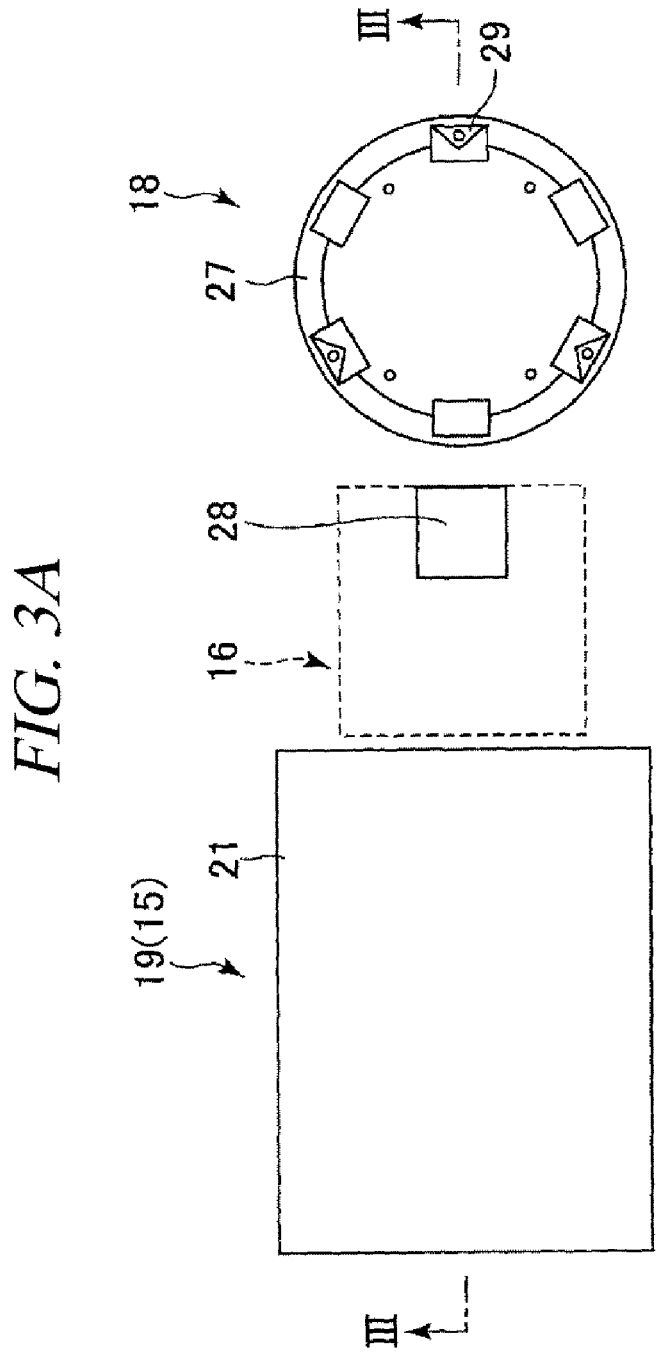
FIG. 3A is a plane view schematically illustrating a configuration of a transfer stage and a tester.

FIG. 3A and FIG. 3B are diagrams schematically illustrating a configuration of the transfer stage and the tester. FIG. 3A is a plane view and FIG. 3B is a cross-sectional view taken along a line III-III in FIG. 3A.

In FIG. 3A and FIG. 3B, as for the tester 15, only a pogo frame 19 (probe card attaching unit), which is a component of the tester 15, is illustrated, and the transfer stage 18 where the probe card 20 is attached is illustrated. Further, in FIG. 3A, the tester-side camera 16 is illustrated as being transparent in order not to cover a part of the transfer stage 18. Furthermore, the tester-side camera 16 is illustrated by a dashed line.

In FIG. 3A and FIG. 3B, the tester 15 includes the pogo frame 19 where the probe card 20 is to be attached. The pogo frame 19 includes an approximately flat plate-shaped main body 21; pogo pins 22 as a group of multiple contact terminals downwardly protruding near a center of a lower surface of the main body 21; an annular card frame 23 arranged to surround the pogo pins 22 on the lower surface of the main body 21; and a protrusion-shaped pin mark 24 (first mark) provided outside the card frame 23 on the lower surface of the main body 21. The pin mark 24 is offset from a center of the pogo frame 19 (to be exact, a center of the card frame 23). A distance from the center of the pogo frame 19 to the pin mark 24 is stored in advance in the controller 17d.

The pogo pins 22 are connected to an inspection circuit of the tester 15 and also brought into contact with multiple electrodes on an upper surface of the probe card 20 attached to the pogo frame 19. The pogo pins 22 are configured to allow electric currents to flow through respective contact probes 25 of the probe card 20 connected to the electrodes and also allow electric currents flowing from electric circuits of the semiconductor devices on the wafer through the respective contact probes 25 to flow through the inspection circuit.

The tester-side camera 16 includes a lens (not illustrated) facing downwardly, and is configured to image a target mark 32 of the probe card 20 attached to the transfer stage 18 moving under the tester-side camera 16 and determine a position of the target mark 32.

The transfer stage 18 is arranged under the tester 15, and includes a flat plate-shaped base member 26, a table-shaped chuck top 27 provided on an upper surface of the base member 26, and a stage-side camera 28 (first camera) which is arranged on the upper surface of the base member 26 to be closer to the pogo frame 19 than the chuck top 27 and includes a lens (not illustrated) facing upwardly.

The probe card 20 is mounted on an upper surface of the chuck top 27, and a middle plate 29 (probe card supporting member) is interposed between the probe card 20 and the chuck top 27.

The chuck top 27 is held on the base member 26 through vacuum attraction, and the middle plate 29 is held on the chuck top 27 through vacuum attraction. Further, the probe card 20 is held on the chuck top 27 through vacuum attraction via the middle plate 29. Therefore, by vacuum-attracting the chuck top 27 to the base member 26 and by vacuum-attracting the middle plate 29 and the probe card 20 to the chuck top 27, it is possible to suppress the middle plate 29 and the probe card 20 from being relatively moved with respect to the transfer stage 18 while the transfer stage 18 is moved.

The method of holding the chuck top 27, the middle plate 29, and the probe card 20 is not limited to the vacuum attraction. For example, the middle plate 29, and the probe card 20 may be held with a clamp or through electromagnetic attraction as long as it is possible to suppress the middle plate 29 and the probe card 20 from being relatively moved with respect to the transfer stage 18.

The transfer stage 18 can be moved. As a result, after the transfer stage 18 moves to the below of the pogo frame 19, the probe card 20 mounted thereon can face the pogo frame 19. Further, by moving the transfer stage 18 toward the pogo frame 19, the probe card 20 mounted thereon can be brought into contact with the pogo frame 19. In the wafer inspection apparatus 10, a movement of the transfer stage 18 is controlled by the controller 17d, and the controller 17d checks a position or a movement amount of the transfer stage 18.

Figure 4A:
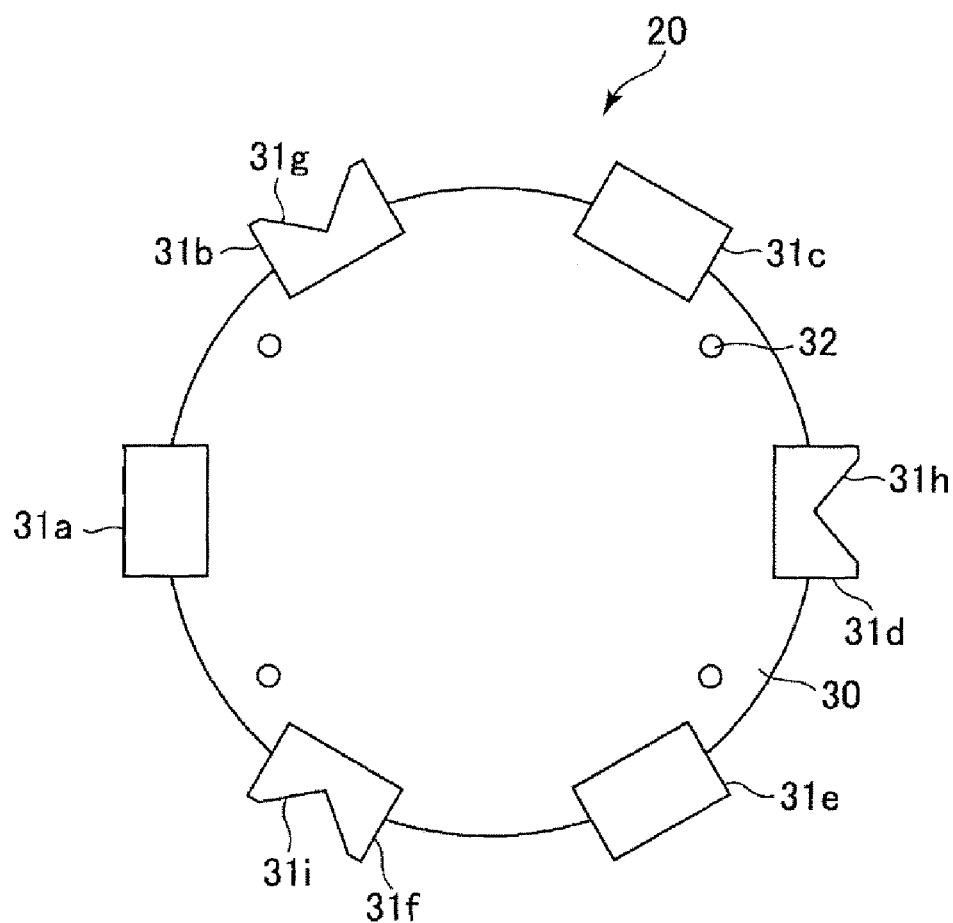
FIG. 4A is a plane view schematically illustrating a configuration of a probe card.
Figure 4B:
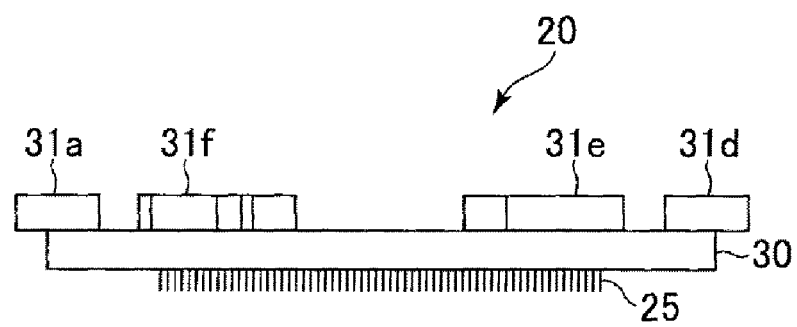
FIG. 4B is a side view schematically illustrating a configuration of the probe card.

FIG. 4A and FIG. 4B are diagrams schematically illustrating a configuration of a probe card. FIG. 4A is a plane view thereof, and FIG. 4B is a side view thereof.

In FIG. 4A and FIG. 4B, the probe card 20 includes a circular plate-shaped main body 30; engagement plates 31a to 31f each having an approximately rectangular shape and protruding toward the outside from a periphery of an upper surface of the main body 30 at the same distance, for example, 60°, from each other; four protrusion-shaped target marks 32 (second mark) equally spaced from each other near the periphery of the upper surface of the main body 30 along a preset circumference around the center of the probe card 20; multiple electrodes (not illustrated) arranged on the upper surface of the main body 30; and multiple contact probes 25 arranged to downwardly protrude from a lower surface of the main body 30. Further, the respective target marks 32 define the circumference along which the target marks 32 are arranged, and, thus, the minimum number of the target marks 32 is 3 by which a preset circumference can be defined, and the target marks 32 do not need to be equally spaced along the circumference.

The electrodes are connected to the corresponding contact probes 25, respectively. The contact probes 25 are brought into contact with electrode pads or solder bumps of each semiconductor device formed on a wafer when the wafer reaches the probe card 20. Further, among the engagement plates 31a to 31f, the engagement plates 31b, 31d, and 31f arranged at a distance of 120° have triangular notches 31g to 31i which are open to the outside when viewed from the plane, respectively.

Figure 5A:
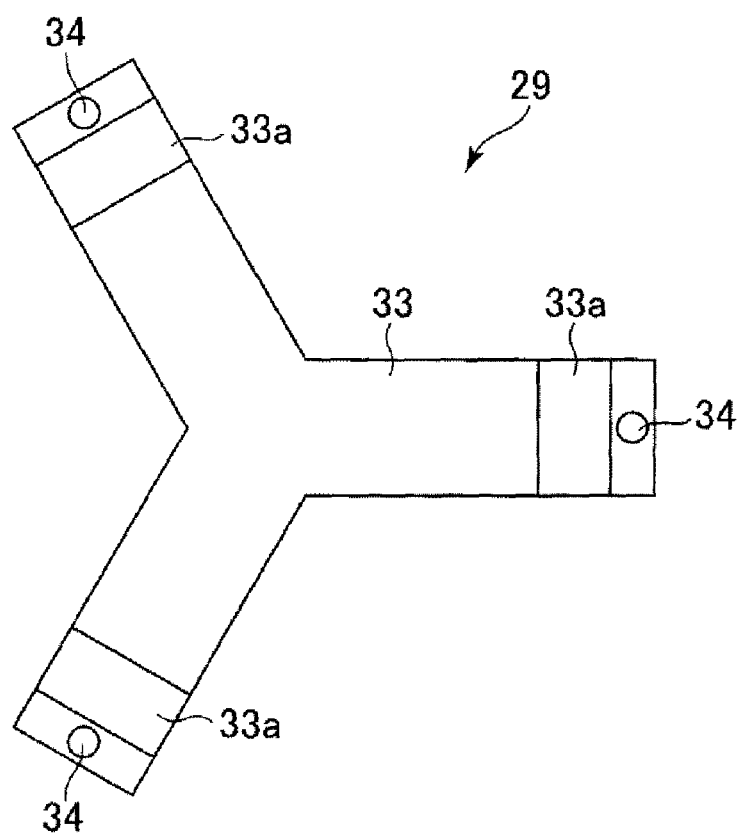
FIG. 5A is a plane view schematically illustrating a configuration of the probe card.
Figure 5B:
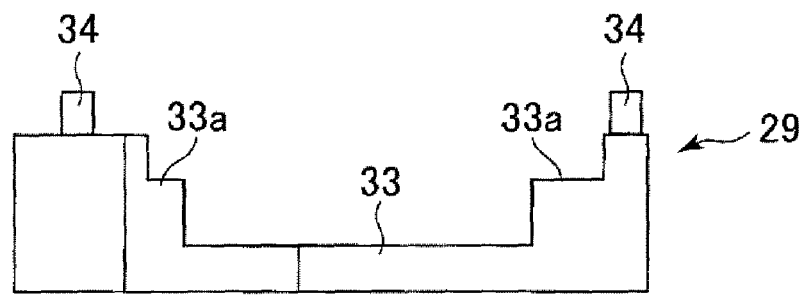
FIG. 5B is a side view schematically illustrating a configuration of the probe card.

FIG. 5A and FIG. 5B are diagrams schematically illustrating a configuration of a probe card. FIG. 5A is a plane view thereof, and FIG. 5B is a side view thereof.

In FIG. 5A and FIG. 5B, the middle plate 29 includes a main body 33 formed of flat plates radially extended at a distance of, for example, 120°; supporting portions 33a upwardly protruding in a two-step shape at leading ends of the main body 33, respectively; and round rod-shaped locating pins 34 upwardly protruding at the second steps of the supporting portions 33a, respectively.

Figure 6A:
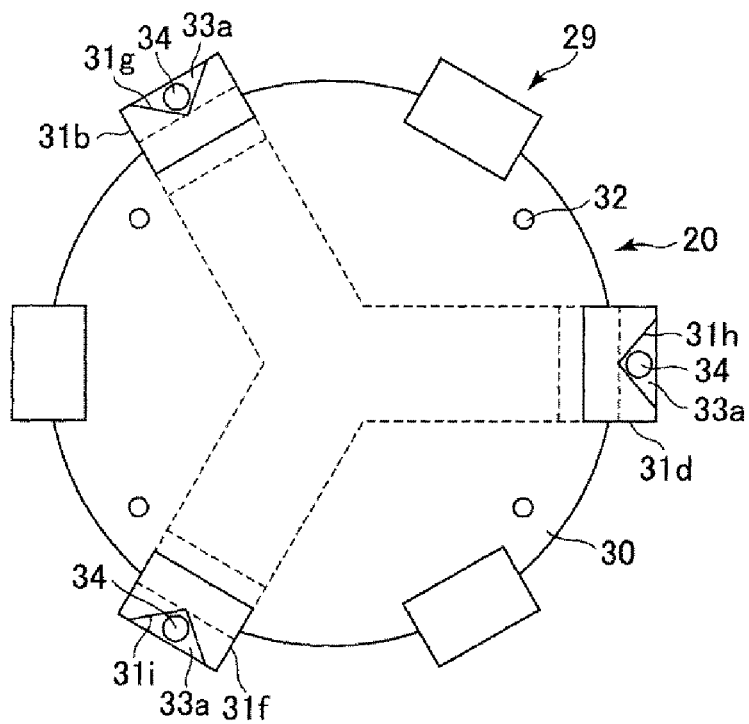
FIG. 6A is a plane view illustrating a mounting state of the probe card on a middle plate.
Figure 6B:
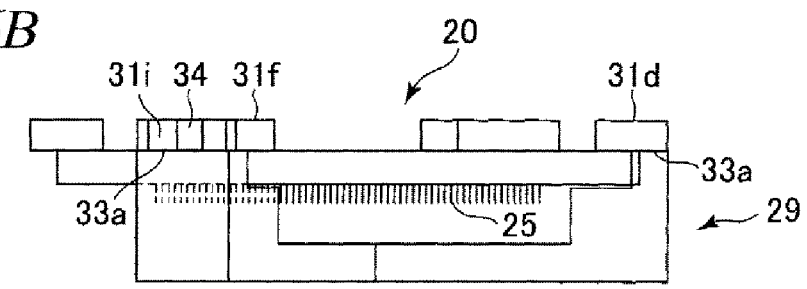
FIG. 6B is a side view illustrating a mounting state of the probe card on the middle plate.

When the probe card 20 and the middle plate 29 are mounted on the chuck top 27 of the transfer stage 18, the engagement plates 31b, 31d, and 31f including the notches 31g to 31i are respectively mounted on the second steps of the supporting portions 33a. Thus, the probe card 20 is supported by the middle plate 29 (see FIG. 6A and FIG. 6B, and a part of the middle plate 29 covered by the probe card 20 is illustrated by a dashed line in FIG. 6A). A height difference between the first step and the second step of each supporting portion 33a is greater than a thickness of the main body 30 of the probe card 20. Thus, the main body 30 is not brought into contact with the first steps of the supporting portions 33a, and the first steps serve as fall preventing flanges for the probe card 20 when the engagement plates 31b, 31d, and 31f are separated from the second steps of the supporting portions 33a.

Figure 6C:
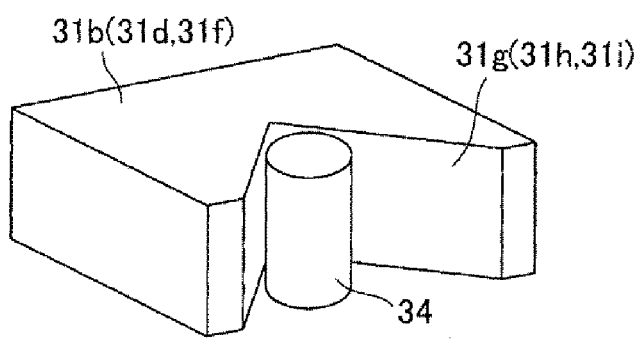
FIG. 6C is a perspective view illustrating an engagement state between an engagement plate of the probe card and a locating pin of the middle plate.

When the engagement plates 31b, 31d, and 31f are mounted on the second steps of the supporting portions 33a, respectively, as depicted in FIG. 6C, the notches 31g to 31i are respectively engaged with the locating pins 34 to restrict a large movement of the probe card 20 with respect to the middle plate 29. Thus, even if the middle plate 29 and the probe card 20 are not vacuum-attracted, it is possible to suppress the engagement plates 31b, 31d, and 31f from being separated from the second steps of the supporting portions 33a, respectively. Further, the notches 31g to 31i do not surround the entire side surfaces of the locating pins 34. Thus, when the probe card 20 is mounted on the middle plate 29, the locating pins 34 are not caught by the side surfaces of the notches 31g to 31i. Therefore, the locating pins 34 do not interfere with mounting of the probe card 20 on the middle plate 29.

Further, a height of the first step of each supporting portion 33a in the middle plate 29 is greater than a protruding degree of each contact probe 25 from the lower surface of the main body 30 in the probe card 20. As a result, even if the engagement plates 31b, 31d, and 31f are respectively separated from the second steps of the supporting portions 33a and the main body 30 is supported by the first steps of the supporting portions 33a, it is possible to suppress each contact probe 25 from being brought into contact with the main body 33 of the middle plate 29. Therefore, it is possible to suppress each contact probe 25 from being damaged or worn.

Hereinafter, a probe card attaching method in accordance with the present example embodiment will be described. The probe card attaching method in accordance with the present example embodiment is individually performed in each pogo frame 19 (tester 15).

FIG. 7A to FIG. 9E are process diagrams illustrating the probe card attaching method in accordance with the present example embodiment.

Figure 7A:
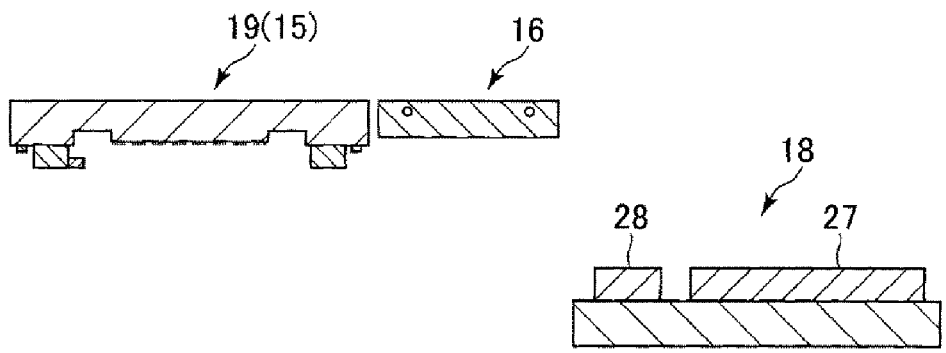
FIG. 7A to FIG. 7D are process diagrams illustrating the probe card attaching method in accordance with the present example embodiment.

Firstly, the tester-side camera 16 is moved toward a front of the pogo frame 19 (tester 15), and then, the transfer stage 18 on which only the chuck top 27 is mounted is moved to the front of the pogo frame 19 (FIG. 7A).

Figure 7B:
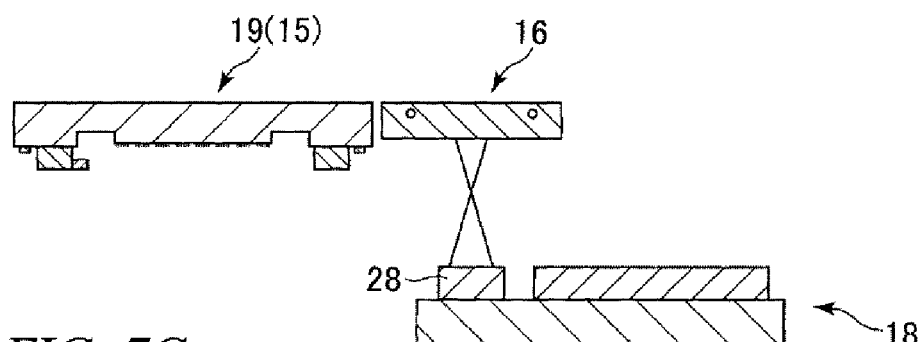

Then, the transfer stage 18 is moved toward the pogo frame 19 to allow the tester-side camera 16 to face the stage-side camera 28 of the transfer stage 18. A position of the transfer stage 18 is further minutely controlled to align the centers of the lenses of the two cameras with each other. The controller 17d determines, as a reference position, a position where the centers of the lenses are aligned with each other and stores therein the reference position (FIG. 7B). After the reference position is determined, the tester-side camera 16 is not moved until the probe card 20 is completely attached.

Further, the centers of the lenses do not necessarily need to be aligned with each other. Any point in a range which can be checked by the lenses may be determined as a reference position and distances from the reference position to the centers of the lenses may be stored in the controller 17d. In this case, when calculating a first distance or a second distance to be described later, the reference position can be corrected based on the distances to the centers of the lenses.

Figure 7C:
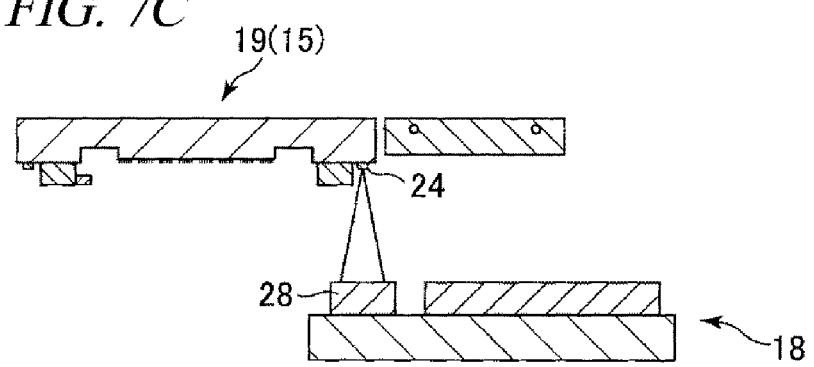

Then, the transfer stage 18 is further moved toward the pogo frame 19 to allow the stage-side camera 28 to face the pin mark 24 of the pogo frame 19, and the stage-side camera 28 checks the center of the pin mark 24 (FIG. 7C). Based on a movement amount of the transfer stage 18 from the reference position, a position of the center of the pin mark 24 (to be exact, a distance from the center of the lens of the stage-side camera 28 to the center of the pin mark 24) in a range which can be checked by the lens of the stage-side camera 28, and a distance from the center of the pogo frame 19 to the pin mark 24, the controller 17d determines the first distance from the reference position to the center of the pogo frame 19 (for example, the sum of a distance from the reference position to the center of the pin mark 24 and a distance from the pin mark 24 to the center of the pogo frame 19), and stores the first distance therein.

Figure 7D:
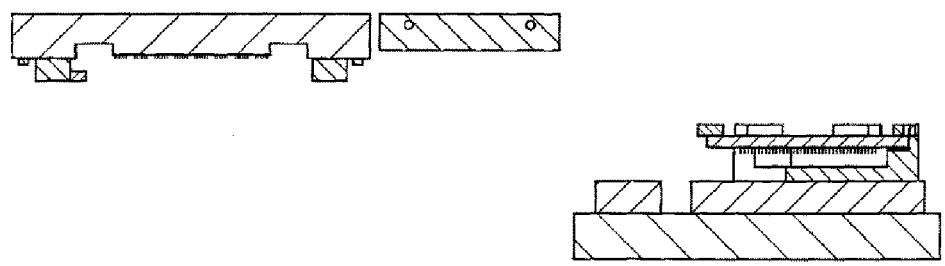

Then, the transfer stage 18 is temporarily returned to the loader 17c, and the middle plate 29 and the probe card 20 are mounted onto the chuck top 27, and then, the transfer stage 18 is moved to the front of the pogo frame 19 again (FIG. 7D). While the transfer stage 18 is moved from the loader 17c to the front of the pogo frame 19, the middle plate 29 and the probe card 20 may not be vacuum-attracted to the chuck top 27.

Figure 8A:
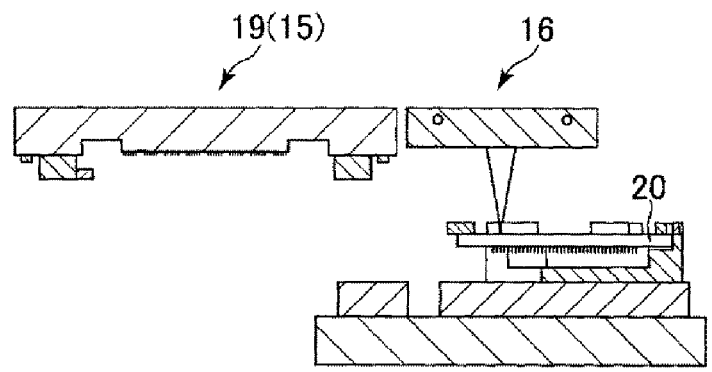
FIG. 8A to FIG. 8D are process diagrams illustrating the probe card attaching method in accordance with the present example embodiment.
Figure 8B:
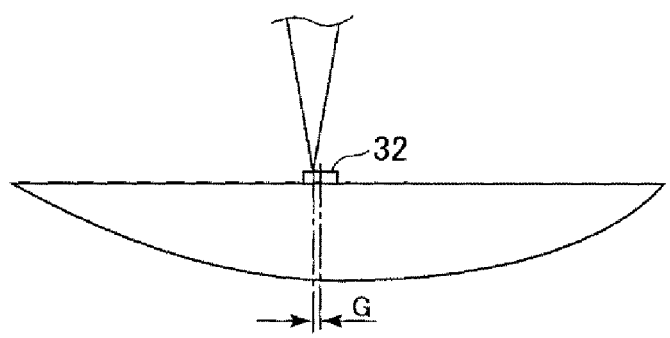

Then, the transfer stage 18 is moved toward the pogo frame 19 to allow each target mark 32 of the probe card 20 to face the tester-side camera 16, and the tester-side camera 16 checks each target mark 32 (FIG. 8A). The controller 17d determines positions of the respective target marks 32 with respect to the reference position based on movement amounts of the transfer stage 18 from the reference position when the respective target marks 32 are checked, and positions of the centers of the respective target marks 32 checked by the lens of the tester-side camera 16 (to be exact, distances from the center of the lens of the tester-side camera 16 to the centers of the respective target marks 32 (denoted as a distance G in FIG. 8B)). Then, the controller 17d defines a circumference along which the respective target marks 32 are arranged based on the determined positions of the respective target marks 32, and determines the second distance from the reference position to the center of the probe card 20 based on the center of the defined circumference (which is identical to the center of the probe card 20), and stores the second distance therein.

In the probe card attaching method in accordance with the present example embodiment, as describe later, positions of the center of the probe card 20 and the center of the pogo frame 19 are adjusted based on the calculated second distance. Thus, after the second distance is determined, the probe card 20 and the middle plate 29 are vacuum-attracted to the chuck top 27 and the chuck top 27 is vacuum-attracted to the base member 26 to suppress the probe card 20 from being relatively moved with respect to the transfer stage 18.

Figure 8C:
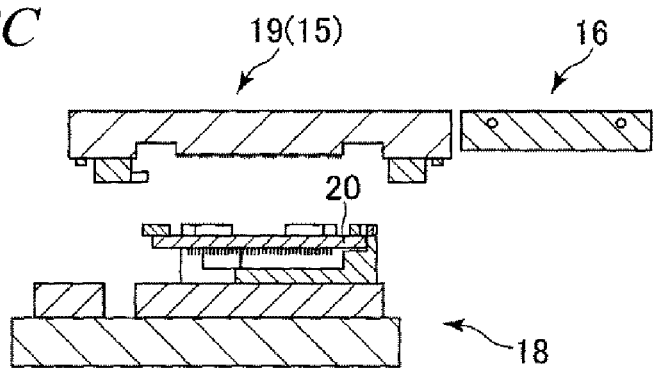

Then, the controller 17d calculates a movement amount of the transfer stage 18 (for example, the sum of the first distance and the second distance) required to allow the center of the probe card 20 to be aligned with the center of the pogo frame 19 based on the reference position, the first distance, and the second distance, and moves the transfer stage 18 based on the calculated movement amount to arrange the center of the probe card 20 to be aligned with the center of the pogo frame 19 (FIG. 8C).

Figure 10A:
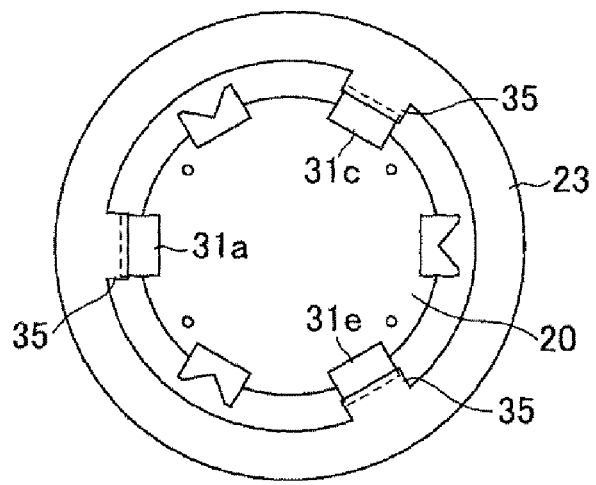
FIG. 10A to FIG. 10C are diagrams explaining a positional relationship between the engagement plate of the probe card and a card fall preventing flange of a card frame in attaching the probe card to a pogo frame.

The card frame 23 of the pogo frame 19 includes three card fall preventing flanges 35 inwardly protruding at a distance of, for example, 120° when viewed from the plane, as depicted in FIG. 10A. When the probe card 20 is moved to the below of the pogo frame 19 by the transfer stage 18 to allow the center of the probe card 20 to be aligned with the center of the pogo frame 19, the engagement plates 31a, 31c, and 31e of the probe card 20 are respectively overlapped with the card fall preventing flanges 35 when viewed from the plane. Thus, if the transfer stage 18 is upwardly raised to bring the probe card 20 into proximity with the pogo frame 19, the engagement plates 31a, 31c, and 31e interfere with the card fall preventing flanges 35, respectively.

Figure 8D:
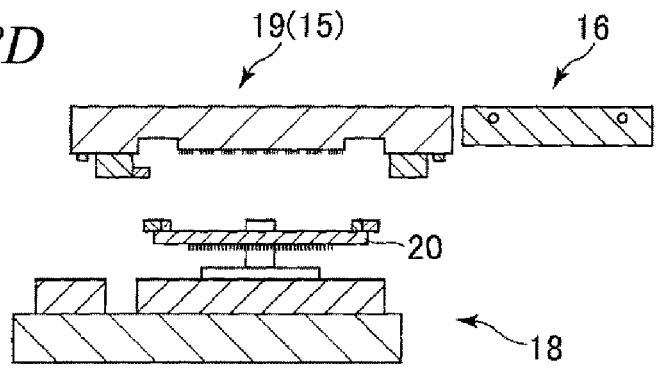
Figure 10B:
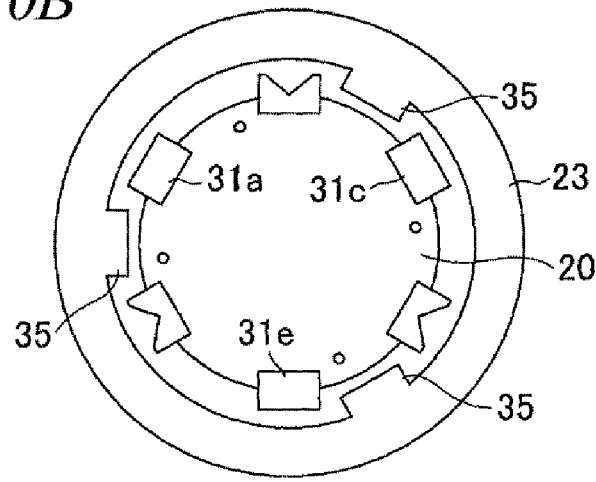

Therefore, in the present example embodiment, after the center of the probe card 20 is aligned with the center of the pogo frame 19, the probe card 20 is horizontally rotated at a preset angle of, for example, 15° on the transfer stage 18 (FIG. 8D). Thus, it is possible to suppress the engagement plates 31a, 31c, and 31e from being overlapped with the card fall preventing flanges 35 when viewed from the plane, respectively, as depicted in FIG. 10B.

Figure 9A:
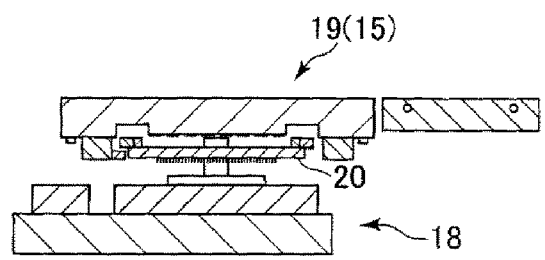
FIG. 9A to FIG. 9E are process diagrams illustrating the probe card attaching method in accordance with the example embodiment.
Figure 9B:
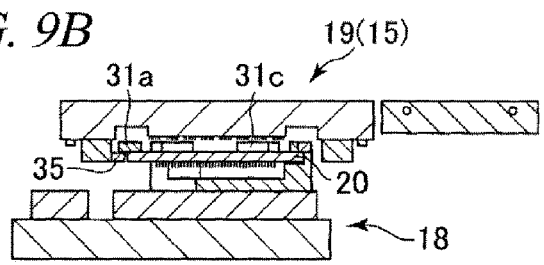
Figure 10C:
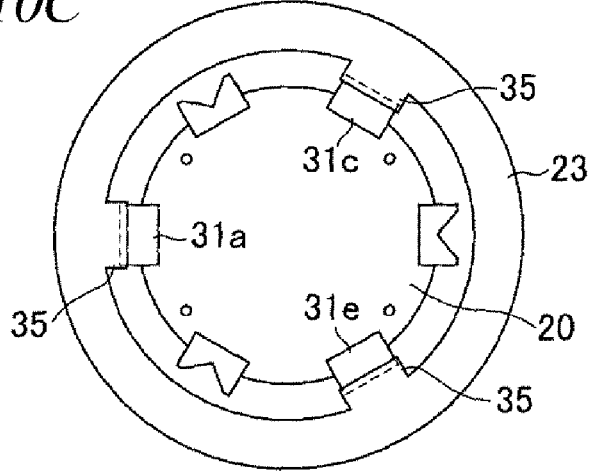

Then, the probe card 20 is brought into proximity with the pogo frame 19 by the transfer stage 18 (FIG. 9A), and after the engagement plates 31a, 31c, and 31e are arranged above the card fall preventing flanges 35, respectively, when viewed from the side, the probe card 20 is horizontally rotated at an angle of, for example, −15° opposite to the preset angle on the transfer stage 18 (FIG. 9B). Herein, as depicted in FIG. 10C, the engagement plates 31a, 31c, and 31e are overlapped with the card fall preventing flanges 35, respectively, when viewed from the plane, and the engagement plates 31a, 31c, and 31e are arranged above the card fall preventing flanges 35, respectively. Thus, for example, even if the probe card 20 falls, the engagement plates 31a, 31c, and 31 e are engaged with the card fall preventing flanges 35, respectively, to suppress the probe card 20 from falling from the card frame 23.

Figure 9C:
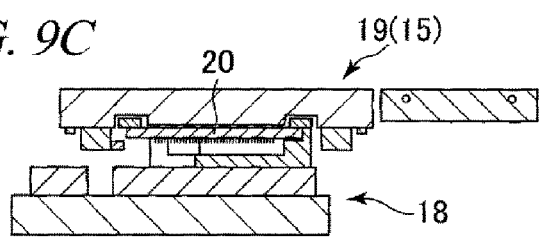
Figure 9D:
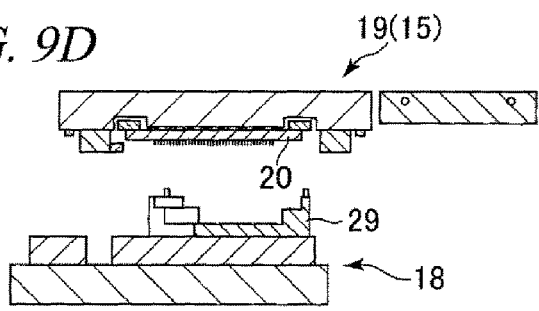

Then, the probe card 20 is further brought into proximity with the pogo frame 19 by the transfer stage 18 to contact the probe card 20 with the pogo frame 19. Then, the probe card 20 is vacuum-attracted to the pogo frame 19, so that the probe card 20 is attached to the pogo frame 19 (FIG. 9C).

Figure 9E:
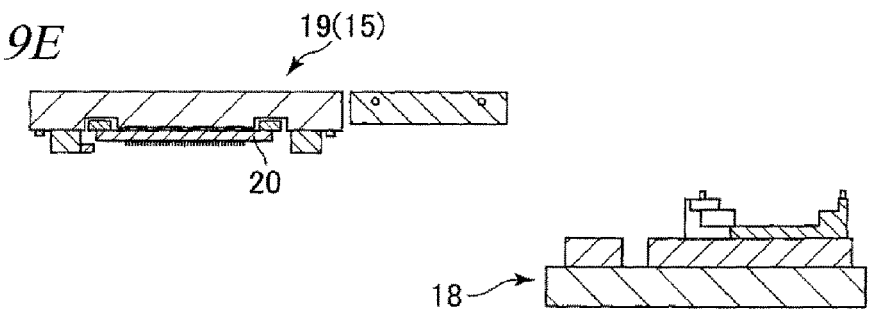

Then, the middle plate 29 is separated from the probe card 20 (FIG. 9D), and the transfer stage 18 is retreated from the below of the pogo frame 19 (FIG. 9E). Thus, the present method is ended.

According to the probe card attaching method of the present example embodiment, the reference position where the center of the lens of the tester-side camera 16 is matched with the center of the lens of the stage-side camera 28, the first distance from the reference position to the center of the pogo frame 19, and the second distance from the reference position to the center of the probe card 20 are determined by the stage-side camera 28 provided at the transfer stage 18 and the tester-side camera 16 provided at the pogo frame 19. Further, the transfer stage 18 is moved based on the determined reference position, first distance and second distance to allow the center of the probe card 20 to be aligned with the center of the pogo frame 19. That is, even if a position of the probe card 20 is deviated with respect to the transfer stage 18, since the second distance from the reference position to the center of the probe card 20 is determined by the tester-side camera 16, it is not necessary to suppress the position of the probe card 20 from being deviated with respect to the transfer stage 18. Thus, it is not necessary to provide a positioning pin or a pin hole. As a result, it is easy to attach/detach the probe card 20 to/from the transfer stage 18.

In the above-described probe card attaching method of the present example embodiment, after the second distance is determined, the probe card 20 and the middle plate 29 are vacuum-attracted to the chuck top 27, and then, the chuck top 27 is also vacuum-attracted to the base member 26. Thus, in a subsequent movement of the transfer stage 18, the probe card 20 is not relatively moved with respect to the transfer stage 18, and reliability of the determined second distance can be improved. It is possible to accurately allow the probe card 20 to be aligned with the pogo frame 19 based on the determined second distance.

Further, the above-described probe card attaching method of the present example embodiment is individually performed in each tester 15. Even if positions of the centers of the respective pogo frames 19 are not uniform, since a reference position, a first distance, and a second distance for each tester 15 are determined, it is possible to accurately allow the center of the probe card 20 to be aligned with the center of the pogo frame 19 in each tester 15.

Hereinafter, a probe card detaching method in accordance with the present example embodiment will be described. The probe card detaching method is also individually performed in each pogo frame 19 (tester 15).

FIG. 11A to FIG. 12D are process diagrams illustrating a probe card detaching method in accordance with the present example embodiment.

Figure 11A:
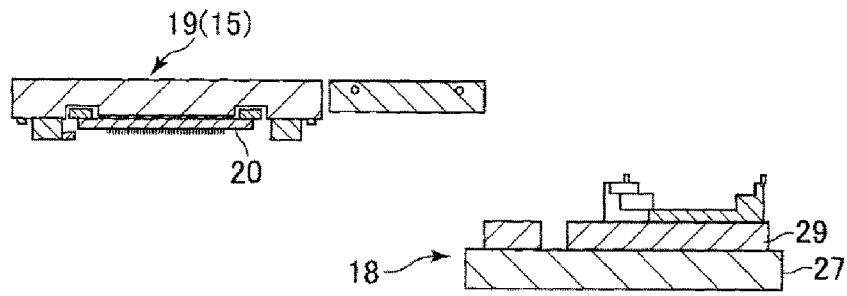
FIG. 11A to FIG. 11E are process diagrams illustrating a probe card detaching method in accordance with the present example embodiment.

Firstly, the tester-side camera 16 is moved to the front of the pogo frame 19 to which the probe card 20 is attached, and then, the transfer stage 18 on which the chuck top 27 and the middle plate 29 are mounted is moved to the front of the pogo frame 19 (FIG. 11A).

Figure 11B:
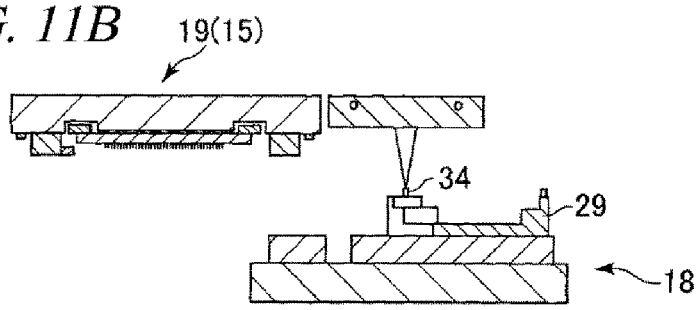

Then, the transfer stage 18 is moved toward the pogo fram 19 to allow a locating pin 34 (third mark) of the middle plate 29 to be aligned with the tester-side camera 16, and the locating pin 34 is checked by the tester-side camera 16 (FIG. 11B). The controller 17d determines a third distance from the reference position to the center of the middle plate 29 based on a movement amount of the transfer stage 18 from the reference position, a position of the center of the locating pin 34 (to be exact, a distance from the center of the lens of the tester-side camera 16 (reference position) to the center of the locating pin 34) in a range which can be checked by the lens of the tester-side camera 16, and a distance from the center of the locating pin 34 to the center of the middle plate 29, and stores the third distance therein. Further, a distance from the center of the locating pin 34 to the center of the middle plate 29 is stored in advance in the controller 17d.

In the probe card detaching method of the present example embodiment, after the third distance is determined, the middle plate 29 is vacuum-attracted to the chuck top 27, and the chuck top 27 is also vacuum-attracted to the base member 26. Thus, it is possible to suppress the middle plate 29 from being relatively moved with respect to the transfer stage 18.

Figure 11C:
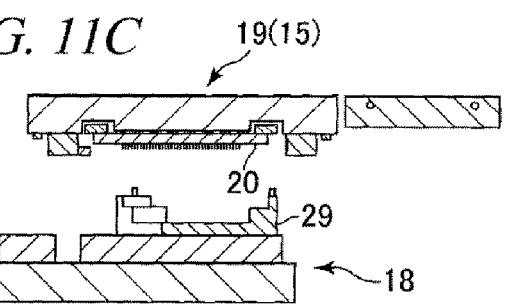

Then, the controller 17d calculates a movement amount of the transfer stage 18 (for example, the sum of the first distance and the third distance) required for allowing the center of the middle plate 29 to be aligned with the center of the probe card 20 attached to the pogo frame 19 based on the reference position, the first distance, and the third distance. Further, the controller 17d moves the transfer stage 18 based on the calculated movement amount to allow the center of middle plate 29 to be aligned with the center of the probe card 20 attached to the pogo frame 19 (FIG. 11C).

Figure 11D:
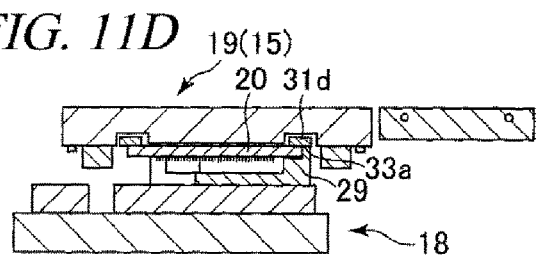

Then, the transfer stage 18 is upwardly raised to bring the middle plate 29 into contact with the probe card 20. To be specific, the second steps of the supporting portions 33a in the middle plate 29 are respectively brought into contact with the engagement plates 31b, 31d, and 31f of the probe card 20 (FIG. 11D).

Figure 11E:
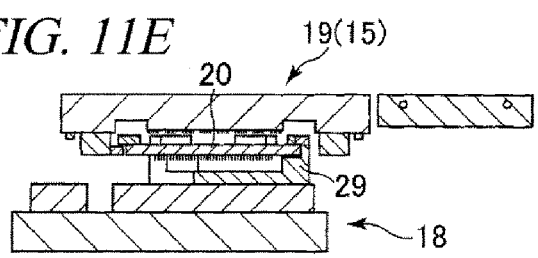

Then, the vacuum attraction between the probe card 20 and the pogo frame 19 is released, and the transfer stage 18 is slightly lowered to separate the probe card 20 from the pogo frame 19 (FIG. 11E).

Figure 12A:
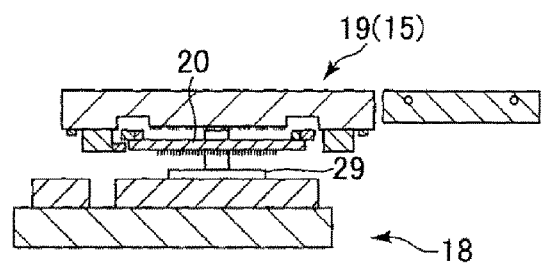
FIG. 12A to FIG. 12D are process diagrams illustrating the probe card detaching method in accordance with the present example embodiment.
Figure 12B:
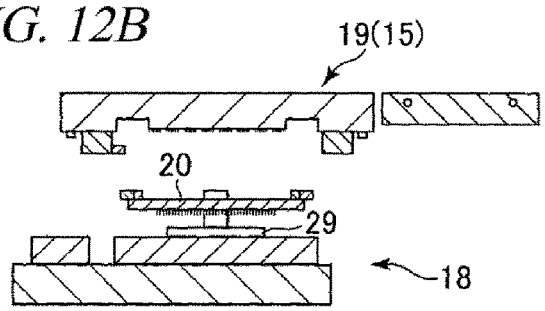
Figure 12C:
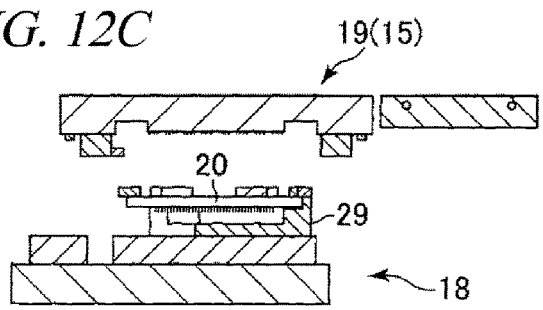

Then, the probe card 20 is horizontally rotated at a preset angle of, for example, 15° on the transfer stage 18 (FIG. 12A), and the probe card 20 is further lowered by the transfer stage 18 (FIG. 12B). Then, the probe card 20 is horizontally rotated at an angle of, for example, −15° opposite to the above preset angle on the transfer stage 18 (FIG. 12C).

Figure 12D:
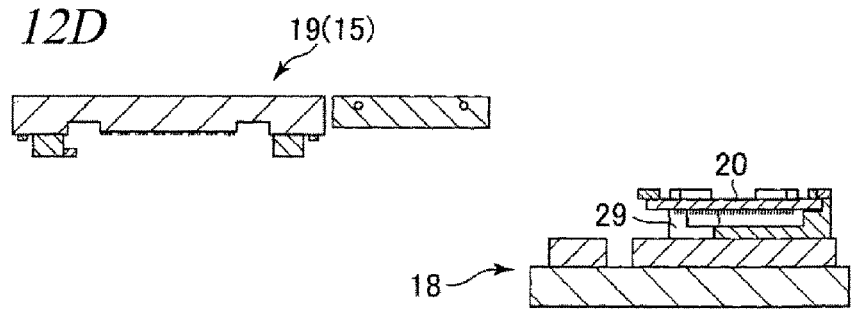

Then, the transfer stage 18 is retreated from the below of the pogo frame 19 (FIG. 12D). Thus, the present method is ended.

According to the probe card detaching method of the present example embodiment, the third distance from the reference position to the center of the middle plate 29 is determined by the tester-side camera 16, and, thus, it is not necessary to suppress the position of the middle plate 29 from being deviated with respect to the transfer stage 18. Thus, it is not necessary to provide a positioning pin or a pin hole. As a result, it is easy to attach/detach the middle plate 29 to/from the transfer stage 18.

In the above-described probe card detaching method of the present example embodiment, after the third distance is determined, the middle plate 29 is vacuum-attracted to the chuck top 27, and the chuck top 27 is also vacuum-attracted to the base member 26. Thus, in a subsequent movement of the transfer stage 18, the middle plate 29 is not relatively moved with respect to the transfer stage 18, and reliability of the determined third distance can be improved. It is possible to accurately allow the middle plate 29 to be aligned with the probe card 20 to which the pogo frame 19 is attached based on the determined third distance.

The present disclosure has been described with reference to the example embodiment, but is not limited thereto.

By way of example, in the above-described example embodiment, the target mark 32 of the probe card 20 or the pin mark 24 of the pogo frame 19 is checked by the cameras (the tester-side camera 16 and the stage-side camera 28), but the checking unit for the target mark 32 or the pin mark 24 is not limited to the camera. A unit, for example, a sensor, capable of checking a position of a protrusion-shaped object can be used.

Further, the above-described probe card attaching method and probe card detaching method of the present example embodiment are applied to the wafer inspection apparatus 10 including the multiple testers 15, but can be applied to a conventional prober including only one tester.

Furthermore, an object of the present disclosure can also be achieved by installing a storage medium which records a program code of software for implementing the function of the above-described example embodiment to a computer (for example, the controller 17d) included in the wafer inspection apparatus 10 and by reading and executing the program code stored in the storage medium through a CPU of the computer.

In this case, the program code read out from the storage medium implements the function of the above-described example embodiment, and, thus, the program code and the storage medium storing the program code constitute the present disclosure.

Further, the storage medium for storing the program code may include any medium that can store the program code, for example, a RAM, a NV-RAM, a floppy (registered trademark) disk, a hard disk, a magneto-optical disk, an optical disk such as a CD-ROM, a CD-R, a CD-RW, and a DVD (DVD-ROM, a DVD-RAM, a DVD-RW, a DVD+RW), a magnetic tape, a nonvolatile memory card, and other ROMs. Alternatively, the program code may be supplied into the computer by downloading it from database or another non-illustrated computer connected to the Internet, a commercial network, or a local area network.

Furthermore, the function of the above-described example embodiment can be implemented by executing the program code read out by the computer, and an OS (operating system) operated on the CPU may perform a part or all of the actual process in response to instructions of the program code and the function of the above-described example embodiment may be implemented by the process.

Moreover, the program code read out from the storage medium may be written in a memory of a function extension board inserted into the computer or a function extension unit connected to the computer, and a CPU of the function extension board or the function extension unit may perform a part or all of the actual process in response to instructions of the program code, and the function of the above-described example embodiment may be implemented by the process.

The program code may include an object code, a program code executable by an interpreter, script data supplied to an OS, or the like.

This patent application claims the benefit of priority to Japanese Patent Application No. 2012-224554 filed on Oct. 9, 2012 and incorporated herein by reference in its entirety.

EXPLANATION OF REFERENCE NUMERALS

10: Wafer inspection apparatus
11: Inspection chamber
15: Tester
16: Tester-side camera
17d: Controller
18: Transfer stage
19: Pogo frame
20: Probe card
24: Pin mark
28: Stage-side camera
29: Middle plate
32: Target mark
34: Locating pin

We claim:

1. A probe card attaching method of respectively attaching probe cards to multiple testers by a transfer stage in a wafer inspection apparatus, including the multiple testers and the transfer stage that transfers a wafer as an inspection target to each of the testers, in which the probe cards each having probes to be contacted with the wafer are attached to the testers, the probe card attaching method comprising:

provifding a first camera configured to face the tester in the transfer stage;

providing a second camera configured to face the transfer stage in the tester;

determining a reference position where the first camera and the second camera are aligned with each other by moving the transfer stage;

determining a position of a probe card attaching unit provided in the tester by checking a first mark provided in the tester with the first camera;

determining a position of the probe card by checking a second mark provided in the probe card mounted on the transfer stage with the second camera;

allowing the probe card to be aligned with the probe card attaching unit by moving the transfer stage based on the determined reference position, position of the probe card attaching unit and position of the probe card; and attaching the probe card to the probe card attaching unit by moving the transfer stage toward the probe card attaching unit, wherein a first distance from the reference position to a center of the probe card attaching unit is determined by checking the first mark with the first camera, a second distance from the reference position to a center of the probe card is determined by checking the second mark with the second camera, and the center of the probe card is aligned with the center of the probe card attaching unit by moving the transfer stage based on the first distance and the second distance, after the second distance is determined.

2. The probe card attaching method of claim 1,
wherein the first mark is offset from the center of the probe card attaching unit,
the first camera determines a position of the first mark, and
the first distance is the sum of a distance from the reference position to the position of the first mark and a distance from the center of the probe card attaching unit to the position of the first mark.

3. The probe card attaching method of claim 1,
wherein the second mark is arranged along a circumference around the center of the probe card.

4. The probe card attaching method of claim 1,
wherein at least after the position of the probe card is determined by the second camera, the transfer stage holds the probe card to suppress the probe card from being relatively moved with respect to the transfer stage.

5. The probe card attaching method of claim 4,
wherein the transfer stage holds the probe card through vacuum attraction.

6. The probe card attaching method of claim 1,
wherein when the probe card is mounted on the transfer stage, the probes of the probe card are protruding toward the transfer stage and a probe card supporting member is interposed between the probe card and the transfer stage.

7. The probe card attaching method of claim 6,
wherein when detaching the probe card from the probe card attaching unit,
a position of the probe card supporting member is determined by checking a third mark provided in the probe card supporting member mounted on the transfer stage with the second camera,
the transfer stage is moved based on the determined reference position, position of the probe card attaching unit and position of the probe card supporting member to allow the probe card supporting member to be aligned with the probe card attaching unit, and
the transfer stage is moved toward the probe card attaching unit to bring the probe card supporting member into contact with the probe card attached to the probe card attaching unit.

8. The probe card attaching method of claim 7,
wherein a third distance from the reference position to a center of the probe card supporting member is determined by checking the third mark with the second camera, and
the center of the probe card supporting member is aligned with the center of the probe card attaching unit by moving the transfer stage based on the first distance and the third distance, after the third distance is determined.

* * * * *